United States Patent
Mustarelli et al.

(10) Patent No.: US 10,505,100 B2
(45) Date of Patent: Dec. 10, 2019

(54) COMPOSITE MATERIAL WITH ELECTROSTRICTIVE PROPERTIES FOR A MECHANICAL ENERGY RECOVERY DEVICE

(71) Applicant: ATOM S.P.A., Vigevano (PV) (IT)

(72) Inventors: Piercarlo Mustarelli, Vigevano (IT); Fabio Invernizzi, Vigevano (IT); Maddalena Patrini, Vigevano (IT); Sergio Dulio, Vigevano (IT)

(73) Assignee: ATOM S.P.A., Vigevano (PV) (IT)

( * ) Notice: Subject to any disclaimer, the term of this patent is extended or adjusted under 35 U.S.C. 154(b) by 86 days.

(21) Appl. No.: 15/817,878

(22) Filed: Nov. 20, 2017

(65) Prior Publication Data

US 2018/0145245 A1 May 24, 2018

(30) Foreign Application Priority Data

Nov. 22, 2016 (IT) .................. 102016000118202

(51) Int. Cl.
*H01L 41/18* (2006.01)
*H01L 41/193* (2006.01)
*C08K 3/013* (2018.01)
*C08L 75/04* (2006.01)

(52) U.S. Cl.
CPC .......... *H01L 41/183* (2013.01); *H01L 41/193* (2013.01); *C08K 3/013* (2018.01); *C08L 75/04* (2013.01)

(58) Field of Classification Search
None
See application file for complete search history.

(56) References Cited

U.S. PATENT DOCUMENTS

| 6,847,153 | B1 * | 1/2005 | Balizer | .................. | C08G 18/10 310/311 |
|---|---|---|---|---|---|
| 2012/0267563 | A1 | 10/2012 | Capsal | | |
| 2017/0022608 | A1 * | 1/2017 | King | .................... | H01G 4/1227 |

FOREIGN PATENT DOCUMENTS

| JP | 2015050432 | 3/2015 |
|---|---|---|
| WO | 2016/026995 | 2/2016 |

OTHER PUBLICATIONS

Pilgrim et al. (Electrostrictive Ceramics for Sonar Projects, Encyclopedia of Materials: Science and Technology, 2001, pp. 2738-2743).*
Italian Search Report and Written Opinion for corresponding IT Application No. 102016000118202 dated Nov. 22, 2016.
Laura J. Romasanta et al: "Towards materials with enhanced electro-mechanical response: CaCu3Ti4O12-polydimethylsiloxane composites", Journal of Materials Chemistry, vol. 22, No. 47, Jan. 1, 2012, p. 24705.
Mishra P. et al: "Enhancement of dielectric properties of 0.2[BZT-BCT]-0.8 [(1-x)epoxy-xCCTO] (x=0.02, 0.04, 0.06, 0.08 & 0.1) composites for embedded capacitor and energy harvesting applications", Journal of Alloys and Compounds, Elsevier Sequoia, Lausanne, CH, vol. 617, Aug. 12, 2014, pp. 899-904.
M. Arbatti et al: "Ceramic-Polymer Composites with High Dielectric Constant", Advanced Materials, vol. 19, No. 10, May 21, 2007, pp. 1369-1372.
Ron Pelrine, et al., Dialectric Elastomers: Generator Mode Fundamentals and Applications, Proceedings SPIE, vol. 4329 (2001), pp. 148-156.

* cited by examiner

*Primary Examiner* — Robert T Butcher
(74) *Attorney, Agent, or Firm* — Abelman, Frayne & Schwab (57) ABSTRACT

A composite material (10) with electrostrictive properties for a mechanical energy recovery device (100) where said composite material comprises a deformable portion (12) in insulating elastomeric polymer material and a filler material (14) homogeneously dispersed in the polymer matrix of said deformable (12) portion, said material or filler (14) being an insulating ceramic material in the form of particles. The invention also concerns said device (100) for the recovery of mechanical energy (100).

12 Claims, 5 Drawing Sheets

COMPOSITE MATERIAL WITH ELECTROSTRICTIVE PROPERTIES FOR A MECHANICAL ENERGY RECOVERY DEVICE

CROSS REFERENCE TO RELATED APPLICATIONS

This application claims priority to IT patent application No. 102016000118202, filed Nov. 22, 2016, which is incorporated herein by reference thereto.

FIELD OF THE INVENTION

The present invention relates to a composite material with electrostrictive properties for a mechanical energy recovery device.

More specifically, the present invention relates to a film of composite material with electrostrictive physical properties for a transducer device of vibrational mechanical energy into electricity which can be integrated into clothing, such as footwear and garments and suitable for recovering the mechanical energy of the movements of the individual. The invention also refers to said energy recovery device.

BACKGROUND OF THE INVENTION

In the prior art special devices are known of suitable for recovering mechanical kinetic energy, or energy harvesting, using vibrating systems operating on fields of varying frequencies typically from about 1 hertz [Hz] to about a few kilohertz [kHz].

These known devices are technical applications able to exploit known physical or chemical properties, such as piezoelectric, electrostatic, electrostrictive or electrochemical properties of some particular materials or composites, with the aim of producing energy transducers able to convert kinetic-vibrational mechanical energy into electricity. The electricity thus generated can be used directly or stored in an electrochemical accumulator or battery.

Said devices can be advantageously used for energy recovery in various fields of application and from any mechanical system that emits or dissipates mechanical energy in the form of vibrational oscillations, such as: the floors of buildings, flyovers, cars, machinery (e.g. jack hammer), etc.; by placing said device in the point where it has the greatest breadth of vibrational oscillation in order to maximize the energy recoverable by said device and convertible into electricity.

A further sought after and advantageous application of these known technologies consists of constructing portable devices suitable for energy recovery able to operate autonomously, adhering firmly to various types of vibrating surfaces, in such a way as to recover the energy, transforming it into electricity to be stored subsequently for later use.

Said portable devices can be incorporated, for example, into traditional soles and insoles for footwear, the latter devices being capable of recovering the kinetic energy generated while walking, energy which is partly dissipated naturally in contact with the ground or other elements. Walking typically produces a mechanical vibration characterized by low oscillation frequencies, generally between about 0.5-10 Hz, and by high amplitude.

The process of producing electricity which the device of the present invention is based on consists of the recovery of mechanical energy or energy harvesting by means of the physical phenomenon of electrostriction of a flexible and electrically insulating material.

Constructive technical solutions of energy recovery devices using the principle of electrostriction provide for the production of a film of material preferably plastic polymer having a thickness traditionally between a few dozen and a few hundred micrometers [μm], said film having the function of a dielectric of a capacitor, generally being coated on both sides by two metal electrodes for example in gold (Au), on the surface of which the necessary electrical contacts can be made in order to configure the armatures of said electric capacitor.

According to a typical embodiment, taken from the technical solution of the composite material with electrostrictive properties for a mechanical energy recovery device of the present invention, on said film, generally rectangular in shape, said gold electrodes are deposited, one on each face, said electrodes being generally the same shape but a slightly different size to each other, so as to leave a thin, non-coated edge such as to prevent the flow of current between the two opposite faces.

Said film is then electrically charged via a power supply unit inside the sole of a shoe, and constrained at the two ends at the metatarsal portion of the foot, where, while walking, a mechanical tension is generated as a result of bending of the foot.

However, said known technical applications based on the electrostriction principle of materials have limitations and operating faults.

Theoretically, to make a film in electrostrictive material any electrically insulating materials, with elastic properties and able to assume a suitable shape, can be used as energy transducers. However, such materials must necessarily have characteristics such that, in practice, the type of material actually utilisable is limited. In particular, good mechanical tensile strength, compressive and bending properties as well as good elasticity are required. The materials possessing these characteristics are elastomeric polymers, which are therefore among the preferred materials for the production of energy recovery devices based on the electrostriction process.

Currently, a number of homo-polymers and copolymers are known of which generate energy through the same physical process as electrostriction, e. g. nylon and terpolymers type P(VDF-TrFE-CTFE) poly-(vinylidenefluoride-trifluoroethylene-chlorotrifluoroethylene) or P(VDF-TrFE-CFE) poly(vinylidenefluoride-trifluoroethylene-chlorofluoroethylene).

The main drawback of these polymeric materials is that they have a greater stiffness and therefore the cyclical deformation of mechanical stretching and relaxation, a mechanical process fundamental to the production of energy, is more difficult. This means that the effective application of these polymeric materials in an energy recovery device is less advantageous, since an overly rigid material can affect and inhibit a natural walk, turning the device from "passive" (an object that the user uses in normal physical activity without influencing it) to "active" (an object that the user perceives the presence of during exercise being forced to make an extra effort because of the same).

A further operating limit of these known elastomeric polymers is the fact that they generally have low values of the relative dielectric constant c r, reducing the amount of electric charge actually storable on the metal armatures of the capacitor.

To overcome this inherent limit of elastomeric polymers, composite materials are advantageously used in the electrostriction process, comprising an amorphous polymer base of elastomeric polymer film with the addition of a ceramic or metal conductive or conductive filler carbon black, nanoparticles of silver or copper). Said conductive filler must, however, be added to the polymer matrix in quantities such as to remain below the electrical percolation threshold (generally 15-20% by volume), in such a way that the composite material does not become electrically conductive, losing the dielectric capacity essential for the functioning of the system. Under these conditions, the particles of conductive filler become polarized due to the electric field applied to the capacitor armatures and contribute to increasing the amount of energy that the composite is able to convert.

Further drawbacks of such composite materials derive from the fact of not being cheap due to the presence of expensive metals, such as copper and silver, and to the fact of possessing a lower electrical resistance due to the presence of the conductive, filler which determines an increase in the dark current through the capacitor, thus introducing a constant energy loss over time.

Composite materials are also known of, in this type of applications, comprising an elastomeric polymer film base with the addition of an insulating filler material, typically ceramic, which has a higher relative dielectric constant c r compared to a conductive filler, with the function of improving the dielectric characteristics of the composite material.

A drawback typical of the latter category of composite materials is due to the fact that the interaction between the ceramic filler and the polymer matrix of the film is not very efficient and the amount of filler needed to achieve a significant increase in the electrical properties concerned is significant; consequently, the composite material is more rigid, brittle, and therefore susceptible to breakage or damage during the mechanical excitation needed for the production of electricity.

Yet a further drawback of these composite materials is that said filler materials are generally obtainable only using complex and expensive chemical processes that require special equipment or reactions involving hazardous reagents, harmful to health and polluting the environment.

DESCRIPTION OF EXAMPLES OF THE PRIOR ART

One example of these known composite materials is described in the U.S. Pat. No. 8,076,829 B2 relative to an electrostrictive composite material comprising a flexible polymeric matrix and a number of conductive materials dispersed in said flexible polymeric matrix having the form of a sheet. Said conductive materials in conjunction form an electrically conductive structure in the flexible polymeric matrix, said material being oriented substantially along a same preferential direction.

A further example of these known composite materials is described in the patent US 2013/0026410 A1 which relates to an electrostrictive composite material comprising a flexible polymeric matrix, a plurality of carbon nano-tubes and a plurality of reinforcing particles dispersed in the flexible polymer matrix. Said nano-carbon tubes together form an electrically conductive network in said flexible polymeric matrix.

US 2012/267563 refers to a "solid composite piezoelectric and/or pyroelectric material, and a method for obtaining the same and the use of such material". Piezoelectricity, however, is the electric charge that accumulates in certain solid materials (such as crystals, ceramics and organic materials such as bone, DNA and various proteins) in response to mechanical stress applied; piezoelectric materials are essentially electro-mechanical transducers, because they convert a mechanical signal into an electrical signal (direct piezoelectricity) and vice versa (reverse piezoelectricity). Pyroelectricity is instead the property of some crystals, which are by nature electrically polarized and therefore contain large electrical fields.

The object of this application is a mechanical energy recovery device based on electrostriction, not piezoelectricity or pyroelectricity.

JP 2015 050432 also presents a solution relative to the development of an actuator, a sensor or a generator based on piezoelectricity, where a piezoelectric ceramic filling is variously placed in different types of polymer matrix and the main compound is potassium niobate (KNbO3), a well-known piezoelectric material. The addition of this material allows an improvement in the performance of the device, namely the piezoelectric performance of the piezoelectric material layer.

The solution of the present application instead uses an inorganic material to produce energy not based on the piezoelectric effect, i. e. electricity is exploited by applying an electric polarisation field to the composite layer.

WO 2016/026995 concerns instead an actuator in which a thermotropic liquid crystal is dispersed in the form of a drop in an elastomeric matrix.

SUMMARY OF THE DISCLOSURE

The purpose of the present invention is to overcome the drawbacks mentioned above.

More specifically, the object of the present invention is to provide a composite material with electrostrictive properties for a mechanical energy recovery device having a significantly higher value of the relative dielectric constant $\varepsilon_r$, enabling the accumulation of a larger amount of electric charge on the metal electrodes.

A further object of the present invention is to provide a composite material with electrostrictive properties for a mechanical energy recovery device having a greater flexibility and resistance to mechanical stresses and a reduced brittleness.

A further object of the present invention is to provide a composite material with electrostrictive properties for a mechanical energy recovery device having a filler material easy and quick to prepare without the use of complex equipment and chemical processes.

Yet a further purpose of the present invention is to provide a composite material with electrostrictive properties for a mechanical energy recovery device able to ensure a high level of efficiency and reliability over time, also such as to be easily and economically produced.

These and other purposes are achieved by the composite material with electrostrictive properties for a mechanical energy recovery device according to the independent claim.

BRIEF DESCRIPTION OF THE DRAWINGS

The technical and functional characteristics of the composite material with electrostrictive properties for a mechanical energy recovery device of the present invention will be more clearly comprehensible from the detailed description below in which reference is made to the appended drawings which show a preferred and non-limiting embodiment and wherein.

DETAILED DESCRIPTION OF THE INVENTION

With particular reference to FIGS. 1a to 3b, the composite material 10 with electrostrictive properties for a mechanical energy recovery device 100 of the present invention belongs to the category of composite materials comprising, in a preferred embodiment:

a deformable portion 12 defining an elastomeric polymer insulation matrix suitable to withstand mechanical stress;

an insulating filler material 14 evenly dispersed in the polymer matrix of said deformable portion 12, said filler material 14 being suitable to improve the dielectric properties of said composite material 10.

Figure 1A:
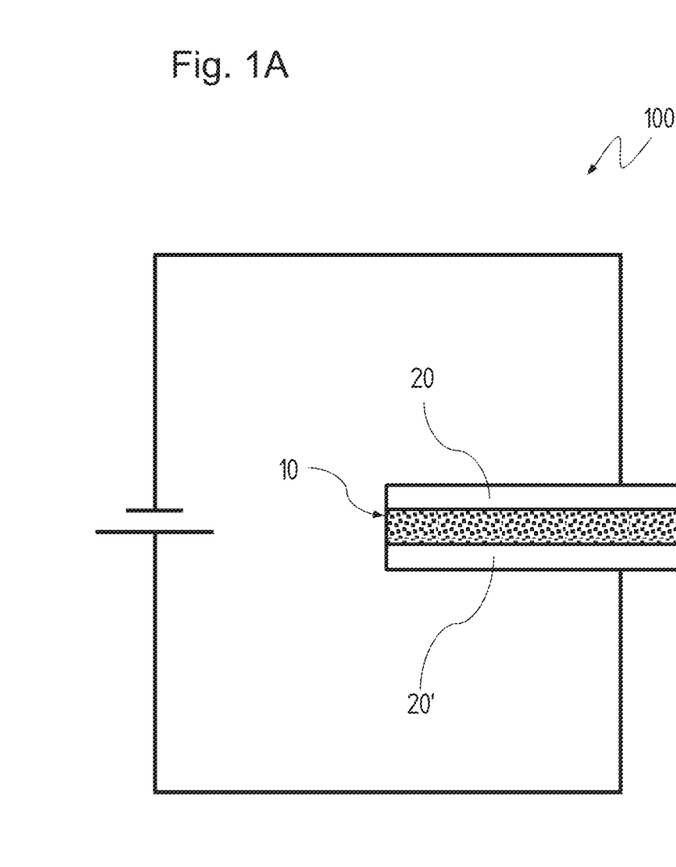
FIG. 1a is a schematic representation of a mechanical energy recovery device based on the electrostrictive properties of the composite material of the present invention.
Figure 1B:
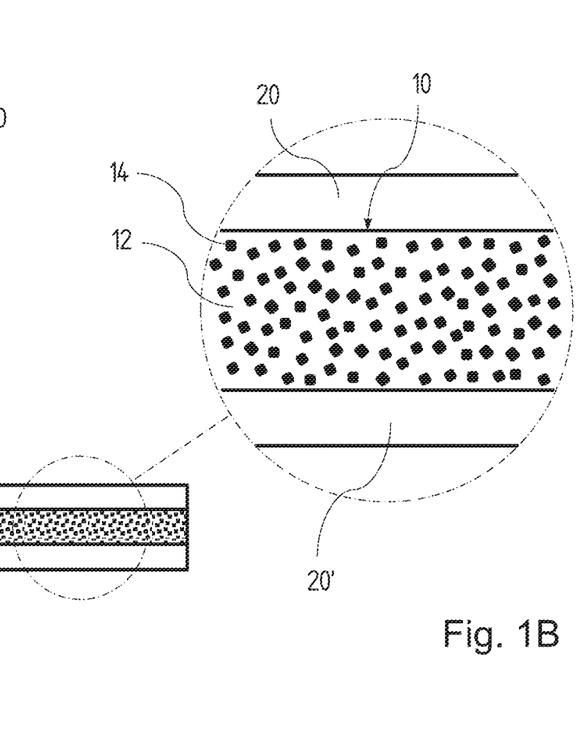
FIG. 1b is a detailed schematic representation of the composite material of the present invention.
Figure 2:
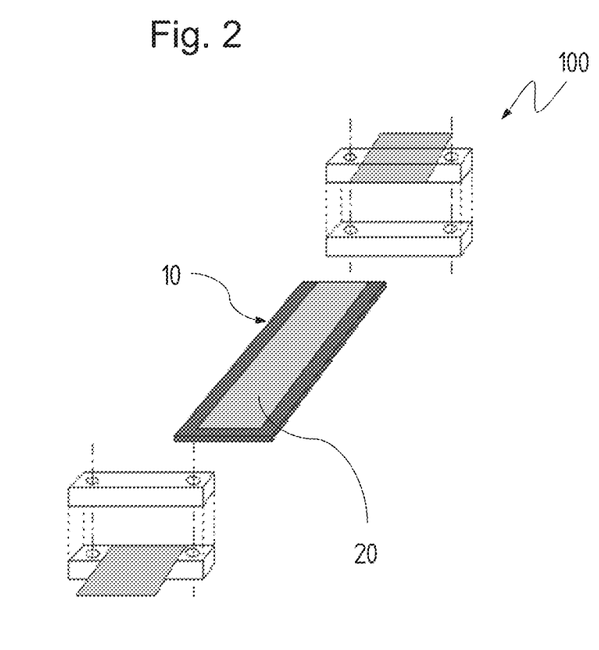
FIG. 2 is a schematic and axonometric representation of an embodiment of the assembly of the mechanical energy recovery device with the metal electrodes and the composite material of the present invention.
Figures 3A, 3B:
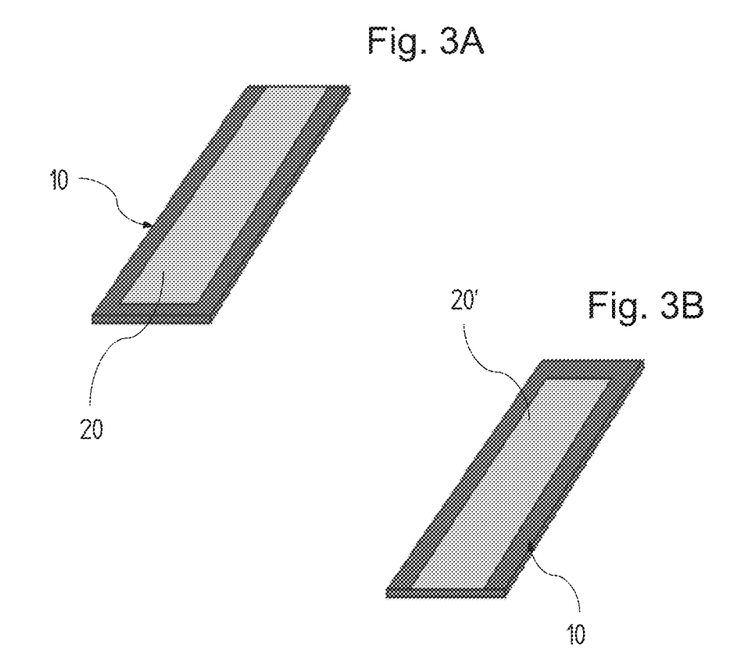
FIGS. 3a and 3b are schematic and axometric representations of an embodiment of the assembly of the mechanical energy recovery device with the metal electrodes arranged respectively on the upper and lower surface of the composite material of the present invention.

For simplicity and clarity of description the filler material 14 is shown in FIG. 1b with reference to a single granule dispersed in the matrix of the deformable portion 12.

With reference to the above figures, said deformable portion 12 generally in a laminar shape and suitable to be partially covered with at least two electrodes 20, 20', comprises an elastomeric polyurethane material in conjunction with said filler material 14 comprising an insulating ceramic material in the form of particles or powder.

The polymer matrix advantageously comprises a film of elastomeric polymer material of polyurethane with good electrostrictive properties and advantageous features of resistance to mechanical stress.

Said insulating filler material 14 may typically comprise an electric insulation ceramic material with a high relative dielectric constant c r such as metal oxides and materials having a perovskitic structure with the general chemical formula type $ABO_3$ of the type: barium titanate ($BaTiO_3$), strontium titanate ($SrTiO_3$), mixed strontium and barium titanates ($SrTiO_3$: $BaTiO_3$), titanium oxide ($TiO_2$ and titanium and titanium lead-zirconate (Pb) $[Zr_xTi_{1-x}] O_3$, PZT). These compounds have values of the relative dielectric constant $\varepsilon_r$ (measured at room temperature) which may vary from $10^2$ to $10^3$.

With specific reference to FIG. 1b, experimental trials have shown the use of a filler material 14 in perovskite class and comprising calcium (Ca), copper (Cu), titanium (Ti) and oxygen (O) (space group: Im3, No 204), with the general chemical formula $CaCu_3Ti_4O_{12}$ or CCTO (calcium titanate and copper), with particularly high values of the relative dielectric constant $\varepsilon_r$, and in the range from about $10^4$-$10^5$ to be particularly advantageous.

Said filler material 14, comprising copper and calcium titanate ($CaCu_3Ti_4O_{12}$), is generally and uniformly dispersed in the amorphous polymer matrix of the deformable portion 12, in the form of particles typically larger than 100 nanometres [nm] or micro-particles. In the main embodiment of the present invention a filler material 14, comprising copper and calcium titanate ($CaCu_3Ti_4O_{12}$) in the form of particles smaller than 100 nanometres [nm] or nanoparticles is advantageously used. The percentages of filler material 14 comprising calcium titanate and copper ($CaCu_3Ti_4O_{12}$) in composite material 10 can range from 10 to 50% of the total volume of said composite material 10.

The deformable portion 12 may advantageously also comprise a thermoplastic elastomeric polyurethane which may usefully comprise differentiated portions composed alternately of "hard" and "soft" components where the ratio of the two components determines the mechanical properties of the polymer matrix.

In a preferred embodiment of the composite material of the invention, the soft component may consist of a chain of poly-(tetrahydrofuran), which makes the final material less susceptible to weathering than those based on polyester chains.

The hard component may instead comprise molecules of 4.4'-methylene-diphenyl-diisocyanate and butanediol. Said hard component defines crystalline zones in an amorphous matrix which correspond to the portion of material which is polarized following the application of the electric field.

Again with reference to FIGS. 1a to 3b, the invention also relates to a mechanical energy recovery (or energy harvesting) device 100 comprising the composite material 10 coated on the top and bottom surfaces by traditional electrodes 20, 20' in conductive metal material, generally gold (Au), said electrodes 20, 20' being suitable to be electrically connected to an electrical circuit of said mechanical energy recovery device 100.

From the description of the characteristics of the composite material with electrostrictive properties for a mechanical energy recovery device of the present invention, its functioning as described below may be inferred.

With starting reference to FIGS. 1a to 3b, the composite material 10 of the present invention is particularly efficient if applied to portable devices capable of recovering energy and particularly suitable to be applied and integrated in shoes, garments and clothing etc.

The thermoplastic polyurethane polymer matrix of the deformable electrostrictive portion 12, compared to a generic matrix comprising a traditional elastomeric polymer adds suitable characteristics of flexibility and resistance to mechanical stress at excellent electrical resistance characteristics and values of the relative dielectric constant ($\varepsilon_r$), required for the efficient functioning of the mechanical energy recovery device 100.

In addition, the polyurethane guarantees a long service life of the device for cyclic movement, e. g. walking, without the occurrence of stress or tears.

The filler material 14 is generally dispersed in the liquid mixture of a thermoplastic polyurethane of the type described above and of its solvent. The suspension of the two compounds is typically poured onto a glass plate which is then placed in a furnace at a temperature of about 80° C. in order to evaporate all the solvent, leaving the material in the form of a thin film. Their combination produces the composite material 100 which has a relative dielectric constant $\varepsilon_r$ significantly greater than the polyurethane considered individually, which translates into a greater accumulation capability of electrical charge on the electrodes 20, 20' and a consequent higher production of electricity.

The $CaCu_3Ti_4O_{12}$ or CCTO is also a compound easy to prepare by mechanical mixing of (harmless) oxides of the constituent elements (Ca, Cu and Ti) followed by heat treatment in a traditional tube furnace for synthesis, or by mixing in solution precursors of the constituent elements with subsequent heat treatment in said traditional tube furnace for synthesis.

Figure 4:
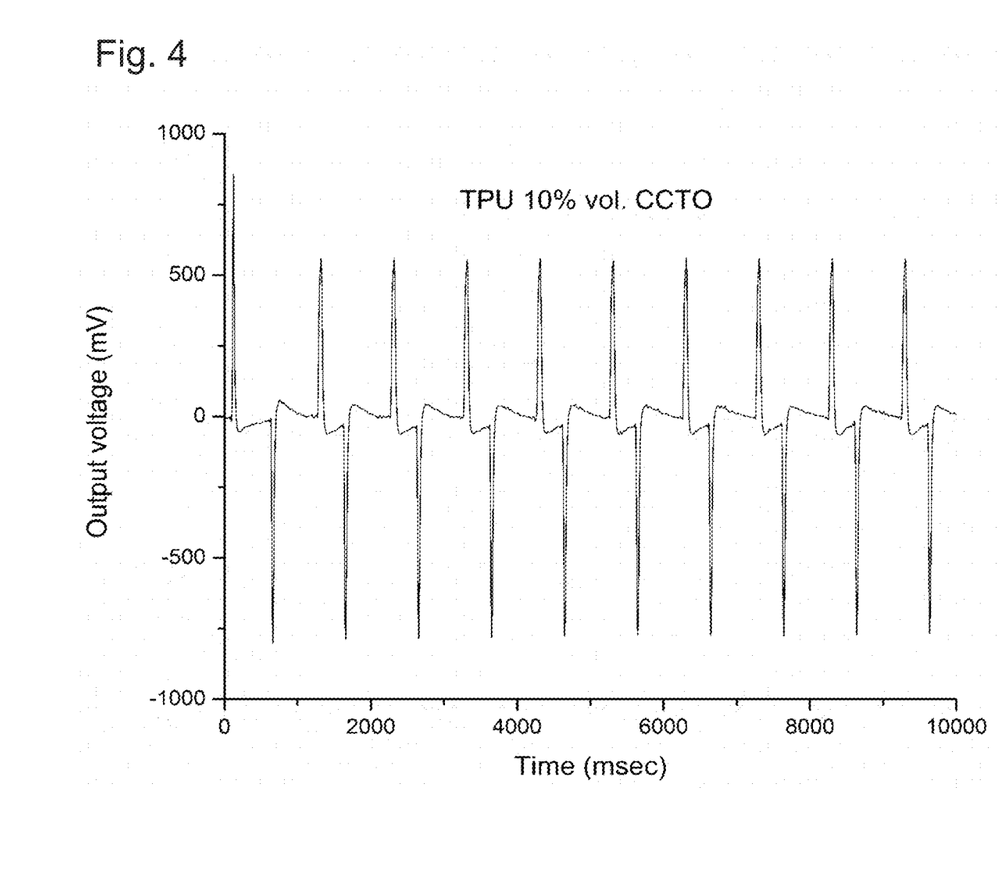
FIG. 4 is a schematic representation of a graph showing the voltage as a function of time in output from the mechanical energy recovery device based on the electrostrictive properties of the composite material of the present invention, when subjected to mechanical stress.

With particular reference to the graph in FIG. 4, which shows the voltage as a function of time in output from the mechanical energy recovery device 100, it can be seen how with the composite material 100 of the invention it is possible to obtain electric voltage values of the order of 800 millivolt[mV]. These values are obtainable with a composite material containing a limited amount of $CaCu_3Ti_4O_{12}$ as filler material 14, an amount equal to 10% of the total composition by volume of said composite material. This ensures a limited decrease in the flexibility characteristics of the polymer matrix of the deformable portion 12.

Figure 5:
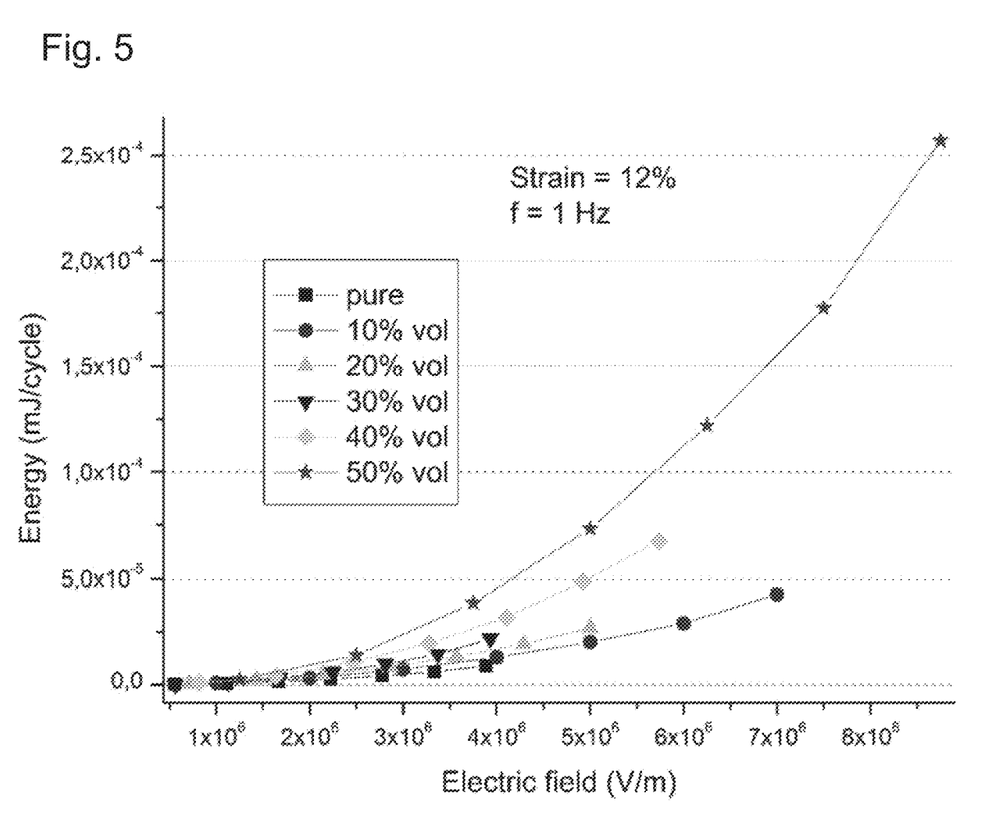
FIG. 5 is a schematic representation of a graph representing the energy obtainable from the device comprising the composite material of the present invention, as a function of the electric polarization field, with different percentage compositions by volume of the composite material of the present invention, in addition to the pure polymer.

With particular reference to the graph in FIG. 5, the energy expressed in millijoule per cycle[mJ/cycle] as a function of the electric field expressed in volts per metre [V/m], obtainable from a device for the recovery of mechanical energy 100 comprising the composite material 10, is shown by experimental data.

It can be seen how, with the same electric field applied to the electrodes 20, 20', the value of energy obtainable from the device increases with the increasing percentage by volume of $CaCu_3Ti_4O_{12}$ in the polymer matrix.

Figure 6:
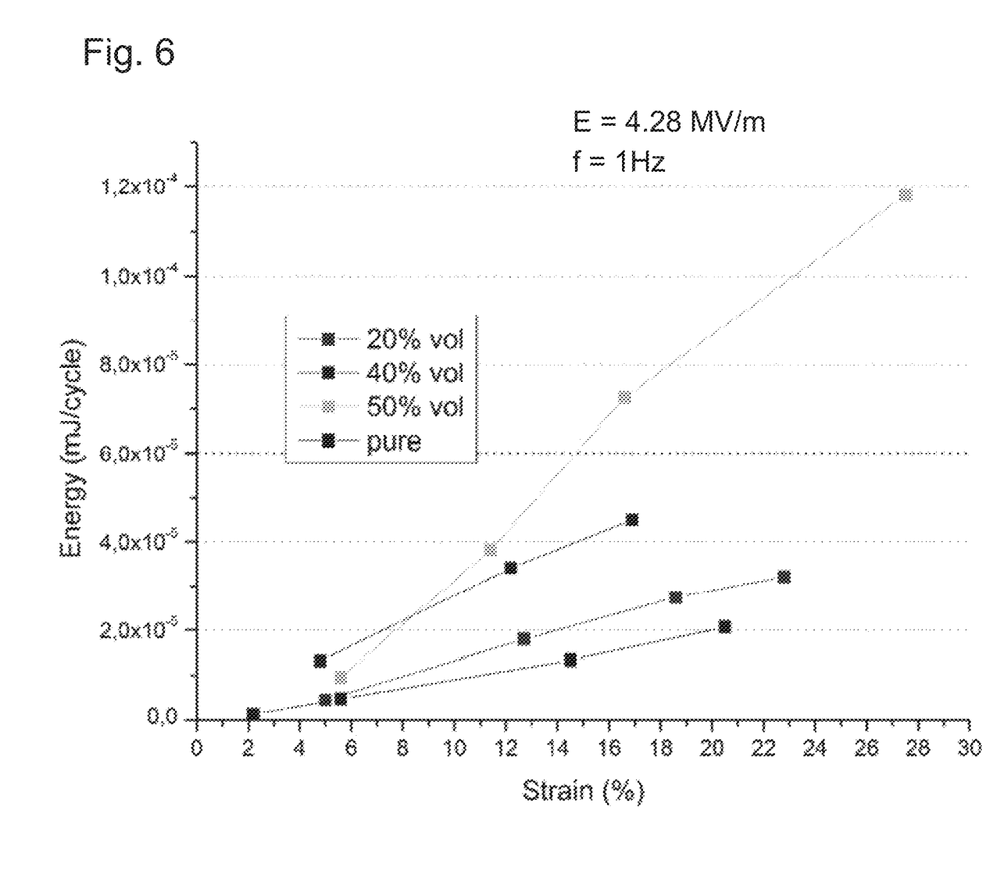
FIG. 6 is a schematic representation of a graph representing the energy obtainable from the device comprising the composite material of the present invention, as a function of polarization electric field with different percentages in volume of the filler in composite material of the present invention, in addition to pure polymer.

With particular reference to the graph in FIG. 6, the energy expressed in millijoules per cycle [mJ/cycle] as a function of the elongation or (strain) deformation percentage, i.e. how much in percentage terms the composite material 10 is stretched is shown by experimental data. In this case too it can be seen how, with the same percentage of elongation or deformation applied, the value of energy obtainable from the device increases with the increase in percentage by volume of $CaCu_3Ti_4O_{12}$ in the polymer matrix.

As may be seen from the above, the advantages which the composite material with electrostrictive properties for a mechanical energy recovery device of the present invention achieves, are evident.

The composite material of the present invention is particularly advantageous in mechanical energy recovery or energy harvesting applications, as it combines the unique and advantageous features of flexibility and mechanical resistance of the thermoplastic polyurethane of the polymer matrix of the deformable portion, increasing the dielectric constant by means of calcium titanate and copper ($CaCu_3Ti_4O_{12}$) with the relative high dielectric constant contained in the composite as filler material.

The relative significantly high dielectric constant ($\varepsilon_r \sim 10^4$-$10^5$ of the $CaCu_3Ti_4O_{12}$, which remains practically unchanged over a wide temperature range, helps to reduce the amount of filler material in the composite material, thus helping to maintain the favourable elasticity characteristics of the polyurethane used.

The $CaCu_3Ti_4O_{12}$ is also particularly advantageous compared to other materials with similar characteristics, as it is easily and quickly synthesised without complex and expensive chemical processes that require special equipment and without using chemical reactions involving hazardous reagents, harmful to health and pollutant to the environment.

Despite the invention having been described above with particular reference to a preferred embodiment, made solely by way of a non-limiting example, numerous modifications and variants will appear evident to a person skilled in the art in the light of the above description. The present invention therefore sets out to embrace all the modifications and variants which fall within the sphere and scope of the following claims.

The invention claimed is:

1. A composite material (10) with electrostrictive properties for a mechanical energy recovery device (100) comprising:
   a deformable portion (12) defining an elastomeric polymer insulation matrix suitable to withstand mechanical stress;
   an insulating filler material (14) evenly dispersed in the polymer matrix of said deformable portion (12), said filler material (14) being suitable to improve the dielectric properties of said composite material (10);
   characterised in that said deformable portion (12) comprises an elastomeric polyurethane material and that said filler material (14) comprises an insulating ceramic material in the form of particles.

2. The composite material (10) according to claim 1, characterised in that said filler material (14) comprises a perovskitic structure material having an $ABO_3$ type general chemical formula.

3. The composite material (10) according to claim 2, characterised in that said perovskitic structure material comprises calcium titanate and copper $CaCu_3Ti_4O_{12}$.

4. The composite material (10) according to claim 3, characterised in that said calcium titanate and copper $CaCu_3Ti_4O_{12}$ is present in 10 to 50% of the total volume of said composite material.

5. The composite material (10) according to claim 3, characterised in that said filler material (14), comprising calcium titanate and copper $CaCu_3Ti_4O_{12}$, is dispersed in the polymer matrix in the form of particles having dimensions greater than or equal to 100 nm.

6. The composite material (10) according to claim 3, characterised in that said filler material (14), comprising calcium titanate and copper $CaCu_3Ti_4O_{12}$, is dispersed in the polymer matrix in the form of particles having dimensions less than 100 nm.

7. The composite material (10) according to claim 1, characterised in that said deformable portion (12) comprises a thermoplastic polyurethane elastomer provided with one or more differentiated layers or portions of material.

8. The composite material (10) according to claim 7, characterised in that said deformable portion (12) comprises a polyurethane having at least one soft component of poly (tetrahydrofuran) suitable to define an amorphous matrix.

9. The composite material (10) according to claim 8, characterised in that said deformable portion (12) comprises a polyurethane having at least one hard component comprised of 4,4'-methylene-diphenyl diisocyanate and butane-diole chemically bonded with each other and bonded with said soft component in which they are dispersed.

10. The composite material (10) according to claim 1, characterised in that said deformable portion (12) has a laminar shape suitable to be partially coated with at least two electrodes (20, 20').

11. A mechanical energy recovery device (100), comprising a composite material (10) with electrostrictive properties and having a
- a deformable portion (12) defining an elastomeric polymer insulation matrix suitable to withstand mechanical stress;
- an insulating filler material (14) evenly dispersed in the polymer matrix of said deformable portion (12), said filler material (14) being suitable to improve the dielectric properties of said composite material 10;

wherein said deformable portion (12) comprises an elastomeric polyurethane material and that said filler material (14) comprises an insulating ceramic material in the form of particles.

12. A mechanical energy recovery device according to claim 11, comprising several layers of the composite material (10), superposed or juxtaposed, using suitable electrical connections, to increase the recovery of mechanical energy.

* * * * *